(12) United States Patent
Mimura et al.

(10) Patent No.: US 6,571,462 B1
(45) Date of Patent: Jun. 3, 2003

(54) ELECTRONIC COMPONENT MOUNTING APPARATUS USING DUPLICATE SOURCES OF COMPONENTS

(75) Inventors: Naoto Mimura, Yamanashi (JP); Hirofumi Obara, Yamanashi (JP); Hiroshi Ogata, Kofu (JP); Chikashi Konishi, Yamanashi (JP)

(73) Assignee: Matsushita Electric Industrial Co., LTD, Osaka (JP)

( * ) Notice: Subject to any disclaimer, the term of this patent is extended or adjusted under 35 U.S.C. 154(b) by 0 days.

(21) Appl. No.: 09/559,168

(22) Filed: Apr. 26, 2000

(30) Foreign Application Priority Data

Apr. 27, 1999 (JP) ............................................ 11-119758

(51) Int. Cl.⁷ ............................. B23P 19/00; H05K 3/30
(52) U.S. Cl. .............................. 29/743; 29/760; 29/833; 29/836
(58) Field of Search ......................... 29/832, 833, 834, 29/836, 729, 739, 741, 743, 744, 759, 760

(56) References Cited

U.S. PATENT DOCUMENTS

| | | | | |
|---|---|---|---|---|
| 5,018,936 A | * | 5/1991 | Izumi et al. | 29/740 |
| 5,740,604 A | * | 4/1998 | Kitamura et al. | 29/740 |
| 6,006,425 A | * | 12/1999 | Fukukura et al. | 29/832 |
| 6,189,207 B1 | * | 2/2001 | Nagae | 29/740 |
| 6,199,272 B1 | * | 3/2001 | Seto et al. | 29/740 |
| 6,216,336 B1 | * | 4/2001 | Mitsushima et al. | 29/721 |
| 6,257,391 B1 | * | 7/2001 | Nishimori et al. | 29/740 |

* cited by examiner

Primary Examiner—Timothy V. Eley

(57) ABSTRACT

Two or more parts feeding sections are provided, and in each of the parts feeding sections, identical combinations of parts cassettes aligned in the same arrangement are prepared. If one or more type of components that are to be picked up at one time by a plurality of suction nozzles is exhausted, the mounting head moves to the other parts feeding section, which provides the same combination of components for all the suction nozzles to pick up the components at one time, so that the mounting operation can be continued without stopping the apparatus for replenishment of components.

3 Claims, 6 Drawing Sheets

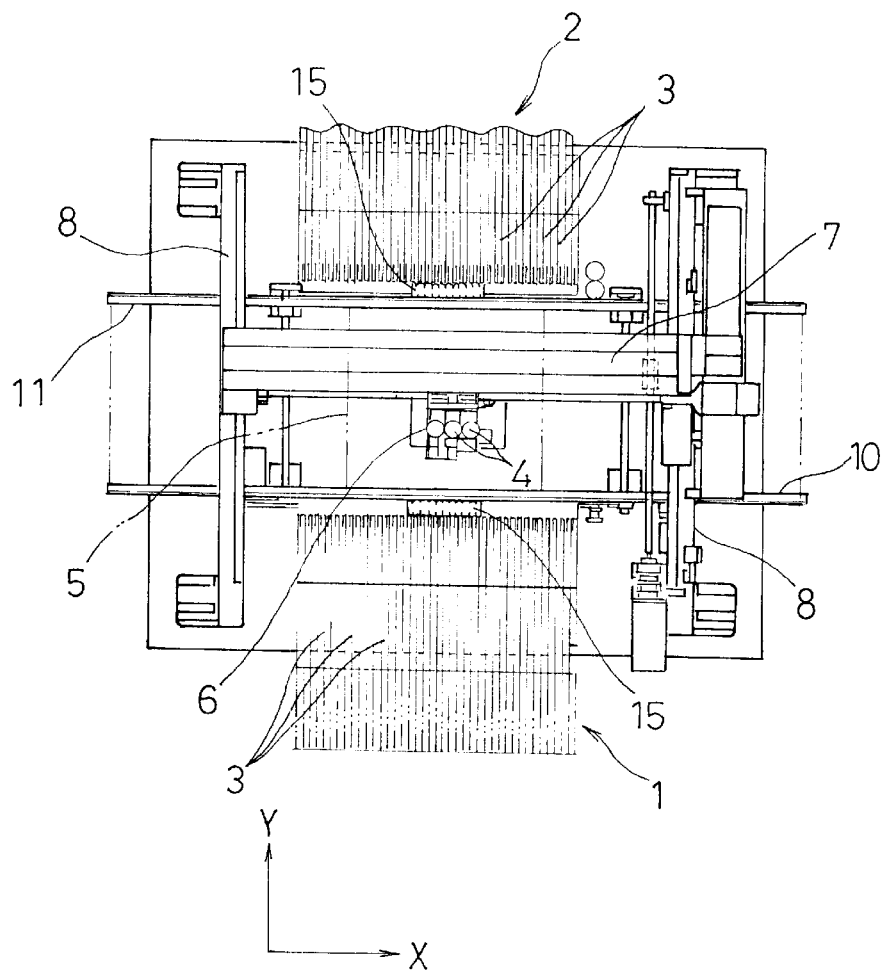
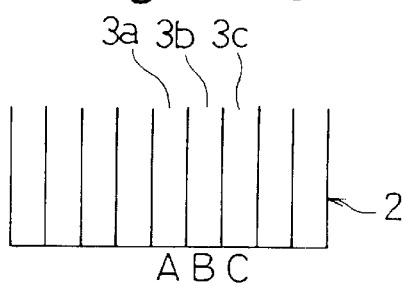
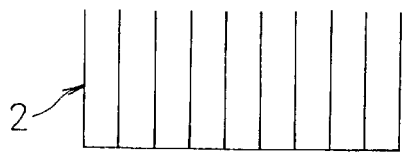
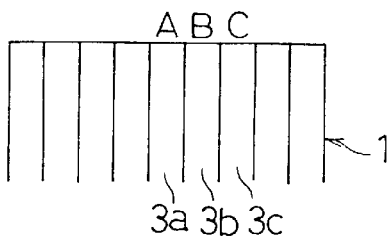
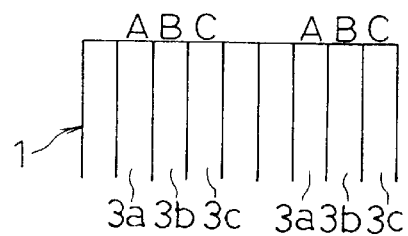

ELECTRONIC COMPONENT MOUNTING APPARATUS USING DUPLICATE SOURCES OF COMPONENTS

BACKGROUND OF THE INVENTION

1. Technical Field of the Invention

The present invention relates to a method of mounting electronic components on a circuit board, whereby the mounting apparatus does not need be stopped frequently for replenishing components.

2. Description of Related Art

FIG. 2A, FIG. 3, and FIG. 4 illustrate the construction of an electronic component mounting apparatus. Parts cassettes 3 respectively accommodating electronic components of each discrete type are aligned in rows opposite each other as first and second parts feeding sections 1, 2, and electronic components fed from these first and second parts feeding sections 1, 2 are mounted onto a circuit board 5 that has been loaded into the apparatus. Mounting of electronic components onto the circuit board 5 is performed by a mounting head 6 that is mounted on an X-axis arm 7 and driven in an X direction. The X-axis arm 7 is mounted on a pair of rails 8, 8 and driven in a Y direction. The mounting head 6 is equipped with a plurality of suction nozzles 4 (three nozzles in the example shown in the drawings), and each of the suction nozzles is driven to move upwards and downwards, or to rotate around its axis on the mounting head 6. The interval of the array of spaced suction nozzles 6 is made correspondent to the distance between two adjacent parts cassettes 3 in the parts feeding sections 1, 2, so that three suction nozzles 4 can pick up three electronic components at one time. Each of the suction nozzles 4 can of course pick up an electronic component independently of the others.

The electronic component mounting apparatus constructed as described above is controlled based on a mounting program, in which the arrangement of parts cassettes and mounting order are set such that the plurality of suction nozzles 4 pick up a plurality of components at the same time in as many cases as possible. One example of such mounting procedure in the prior art—, wherein a plurality of suction nozzles 4 pick up several components at one time—will be explained by referring to the flowchart of FIG. 6. Reference numerals S51 to S60 in the drawing that will be referred to in the description below respectively represent each process step of the mounting procedure.

First, the mounting head 6 moves toward the first parts feeding section 1 (S51), and each of the suction nozzles 4 picks up electronic components respectively at the same time (S52). At the next step, it is determined whether all of the suction nozzles 4 have picked up their respective components (S53), and if yes, the procedure proceeds to the step S57, where mounting of each component onto a circuit board 5 is effectuated. The above actions are repeated unless the parts feeding section fails to feed components because of component exhaustion. When it is determined that mounting of components to one circuit board 5 has been completed (S58), the circuit board 5 is unloaded from the apparatus, while a new circuit board 5 is loaded into the apparatus (S59), and the above described actions are started again.

Meanwhile, when one or more of the components to be picked up by the plurality of suction nozzles 4 is/are exhausted, and if the second parts feeding section 2 accommodates components of the same type that has been exhausted (S54), the mounting head 6 moves to the second parts feeding section 2 (S55), so as to cause the suction nozzle 4 that has not picked up a component previously in the first parts feeding section because of component exhaustion to pick up the component of the same type that has been exhausted (S56). Thereby, all of the suction nozzles 4 hold their respective components, and the mounting procedure can be continued from the step S57 onwards.

In case the components of the type that has been exhausted in the first parts feeding section 1 are not in the second feeding section 2 either, the mounting action cannot be continued further. The apparatus is thus brought to a halt (S60) and not restarted until the components that have been exhausted are replenished.

According to the method described above, it takes time for the mounting head to move to the second parts feeding section each time one type of components of the three components that are to be picked up by the suction nozzles at one time is exhausted, and for the suction nozzles to move upward and downward twice for picking up three components instead of picking them up at one time, with attendant loss in production.

SUMMARY OF THE INVENTION

In view of the foregoing, an object of the present invention is to provide a method of mounting electronic components with which the apparatus does not need be stopped frequently because of component exhaustion so as to minimize loss in production.

According to the present invention, identical sets of parts cassettes for feeding a plurality of components to be picked up at one time by a plurality of suction nozzles are prepared in the same order in a plurality of parts feeding sections. Therefore, even when one or more of the components of a predetermined combination at one parts feeding section is exhausted, the other parts feeding section can provide the same set of components in the same order for simultaneous pick-up by the suction nozzles. While the provision of a plurality of suction nozzles offers an advantage of reducing the time for mounting operation by picking up several components at one time, such advantage cannot be taken when one of the components is exhausted, whereupon simultaneous pick-up of several components is no longer possible. The present invention method enables mounting operation to be continued even when components are exhausted at one parts feeding section, with attendant enhancement in production.

While novel features of the invention are set forth in the preceding, the invention, both as to organization and content, can be further understood and appreciated, along with other objects and features thereof, from the following detailed description and examples when taken in conjunction with the attached drawings.

BRIEF DESCRIPTION OF THE DRAWINGS

FIG. 2A is a plan view showing the construction of the component mounting apparatus, and FIG. 2B, 2C are schematic diagrams of two parts feeding sections;

DETAILED DESCRIPTION OF THE PREFERRED EMBODIMENTS

Figure 1:
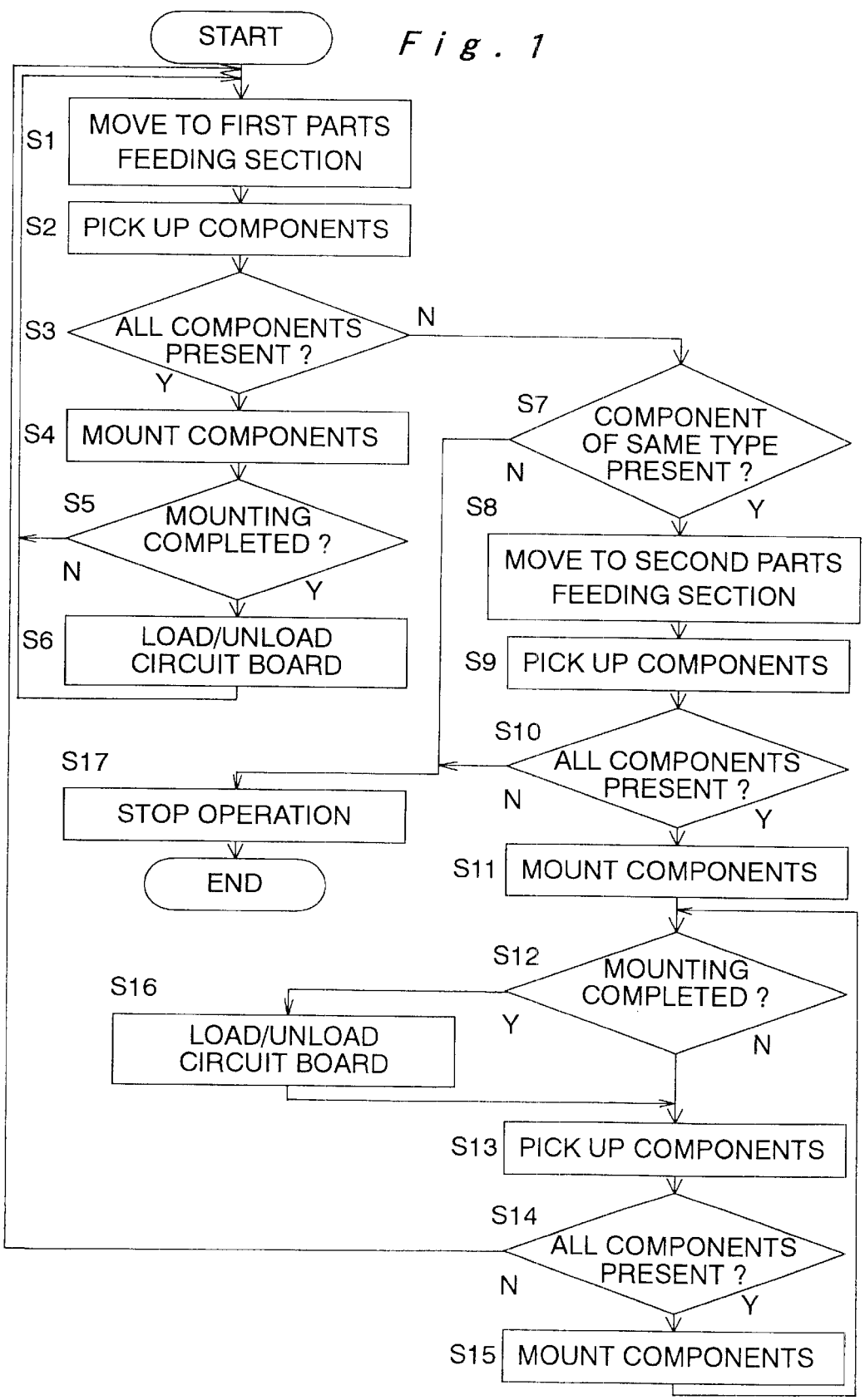
FIG. 1 is a flowchart showing the mounting procedure according to the component mounting method of the present invention.

One embodiment of the present invention will be hereinafter described by referring to the accompanying drawings.

First, the construction of the electronic component mounting apparatus to which the mounting method according to the present invention is applied will be described with reference to FIG. 2 to FIG. 5.

FIG. 2A is a plan view of the component mounting apparatus. A circuit board 5 on which electronic components are mounted is loaded into the apparatus by a loader 10, and is fixedly positioned at a predetermined load position. An X-axis arm 7, on which a mounting head 6 is mounted to be movable along an X-axis direction, is mounted on a pair of Y-axis arms 8, 8 and is driven to move along a Y-axis direction. The mounting head 6 is thus capable of moving in the X-Y plane freely by the movement of the X-axis arm 7 in combination with its movement on the Y-axis arms 8, 8. A first and a second parts feeding sections 1, 2 are arranged opposite to each other, in which a multiplicity of parts cassette 3 for each type of components are aligned in parallel to each other. Components of each type are discharged respectively from the distal ends of the first and second parts feeding sections 1, 2.

Figure 3:
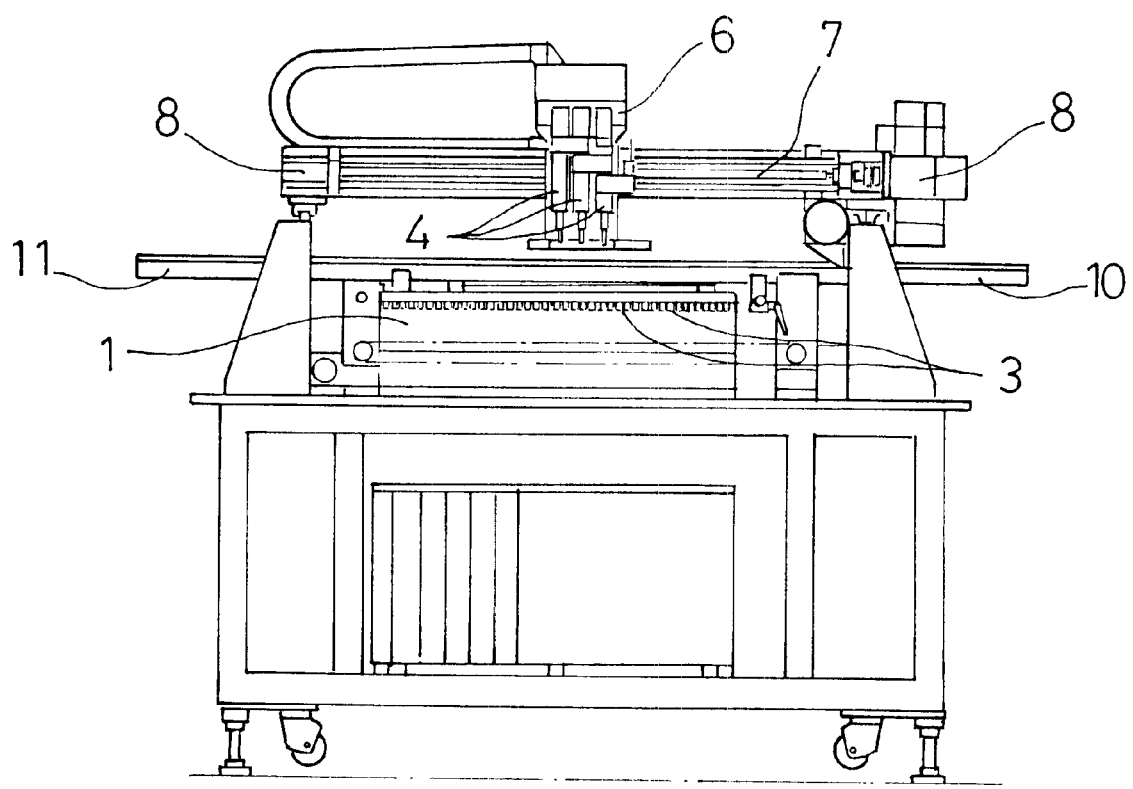
FIG. 3 is a front view showing the construction of the component mounting apparatus.
Figure 4:
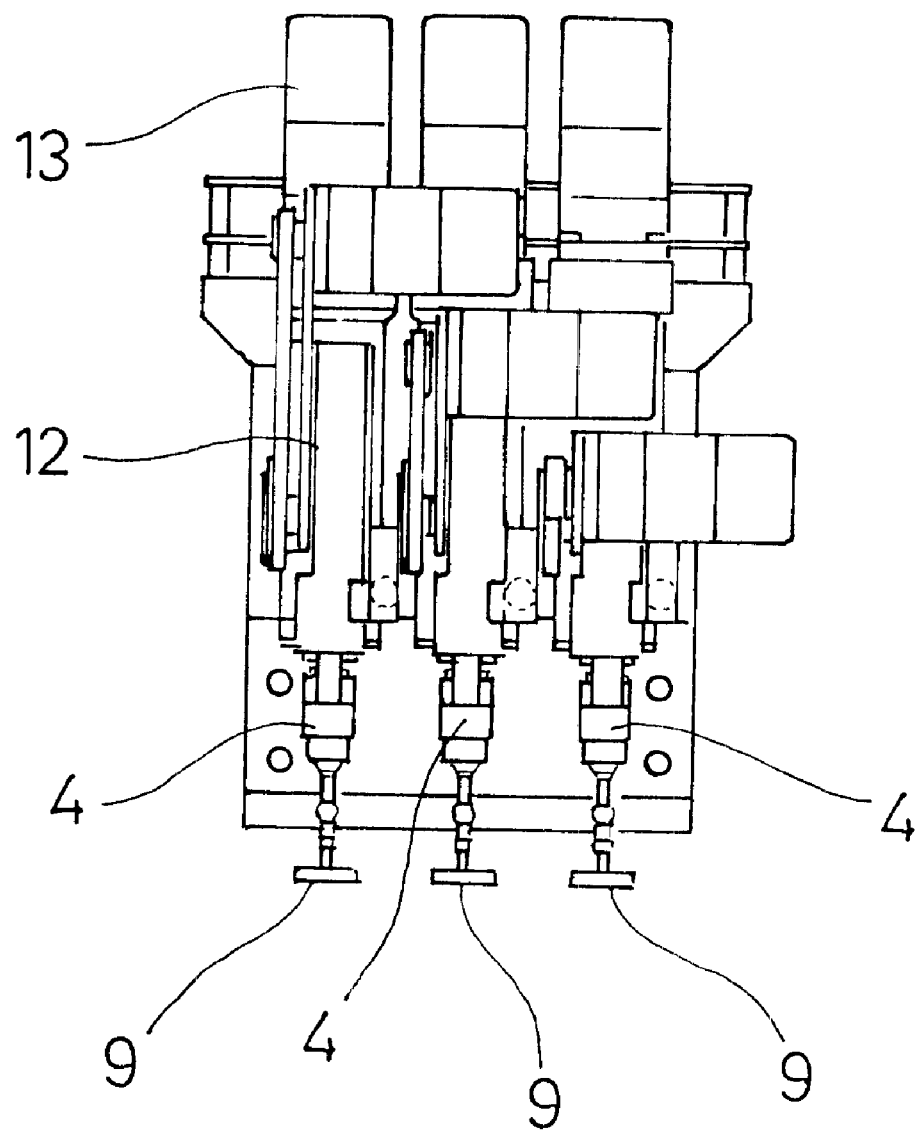
FIG. 4 is a front view showing the construction of suction nozzles mounted on the mounting head.

The mounting head 6 is equipped with an array of three spaced suction nozzles 4 as shown in FIG. 3, and is capable of picking up three components at one time from either the first or the second parts feeding section. The distance between adjacent suction nozzles 4 and the distance between adjacent parts cassettes 3 are made correspondent to each other, with the arrangement of parts cassettes 3 according to the types of components contained therein variously set, so that the three suction nozzles 4 can pick up three components of predetermined types in a predetermined arrangement. Each suction nozzle 4 is removably mounted on a lifting/lowering mechanism 12 and on a rotary mechanism 13, so that it is capable of descending above a given parts cassette 3 by the lifting/lowering mechanism 12 and picking up a component 9 by vacuum suction. When the mounting head 6 has moved to a predetermined position on the circuit board 5, the suction nozzle 4 holding the component 9 is lowered by the lifting/lowering mechanism 12, and is rotated at the same time to a predetermined mounting angle, so as to mount the component at the predetermined position on the circuit board 5 at the predetermined angle.

Figure 5:
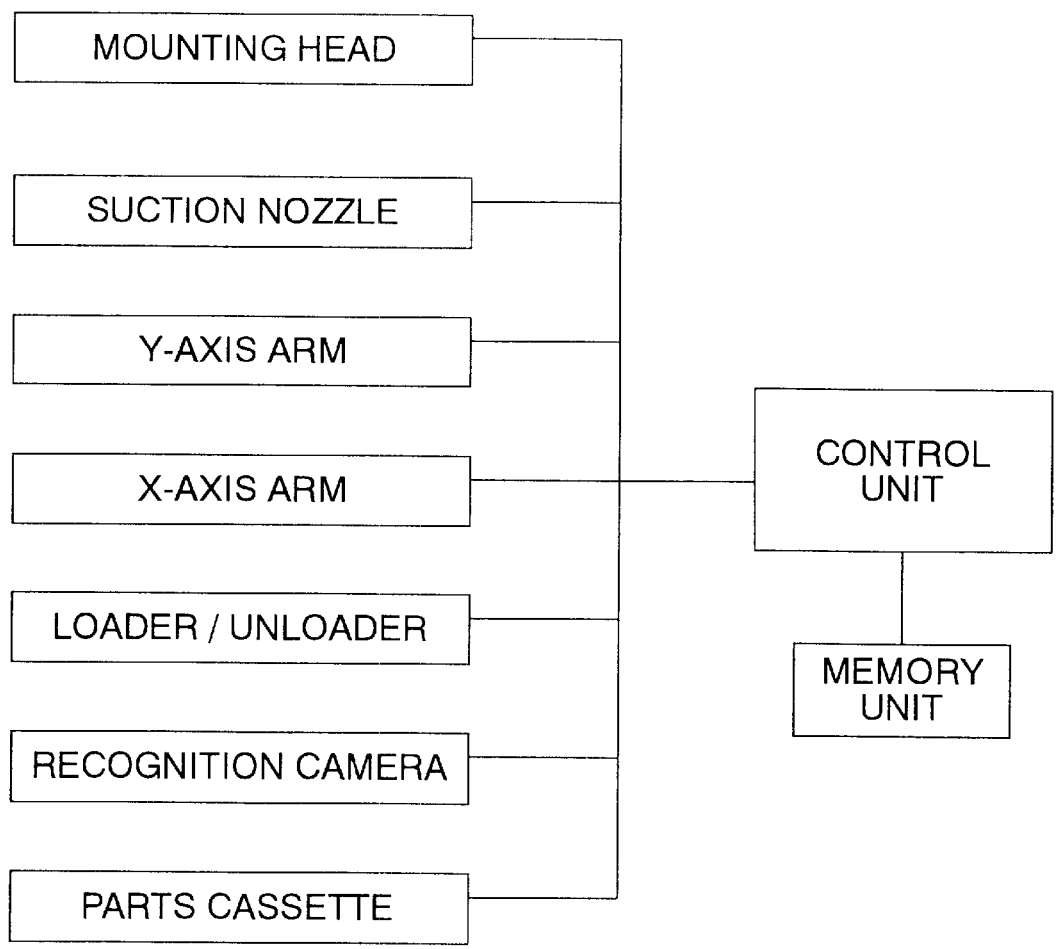
FIG. 5 is a diagram showing the construction of a control unit in the electronic component mounting apparatus of the present invention.
Figure 6:
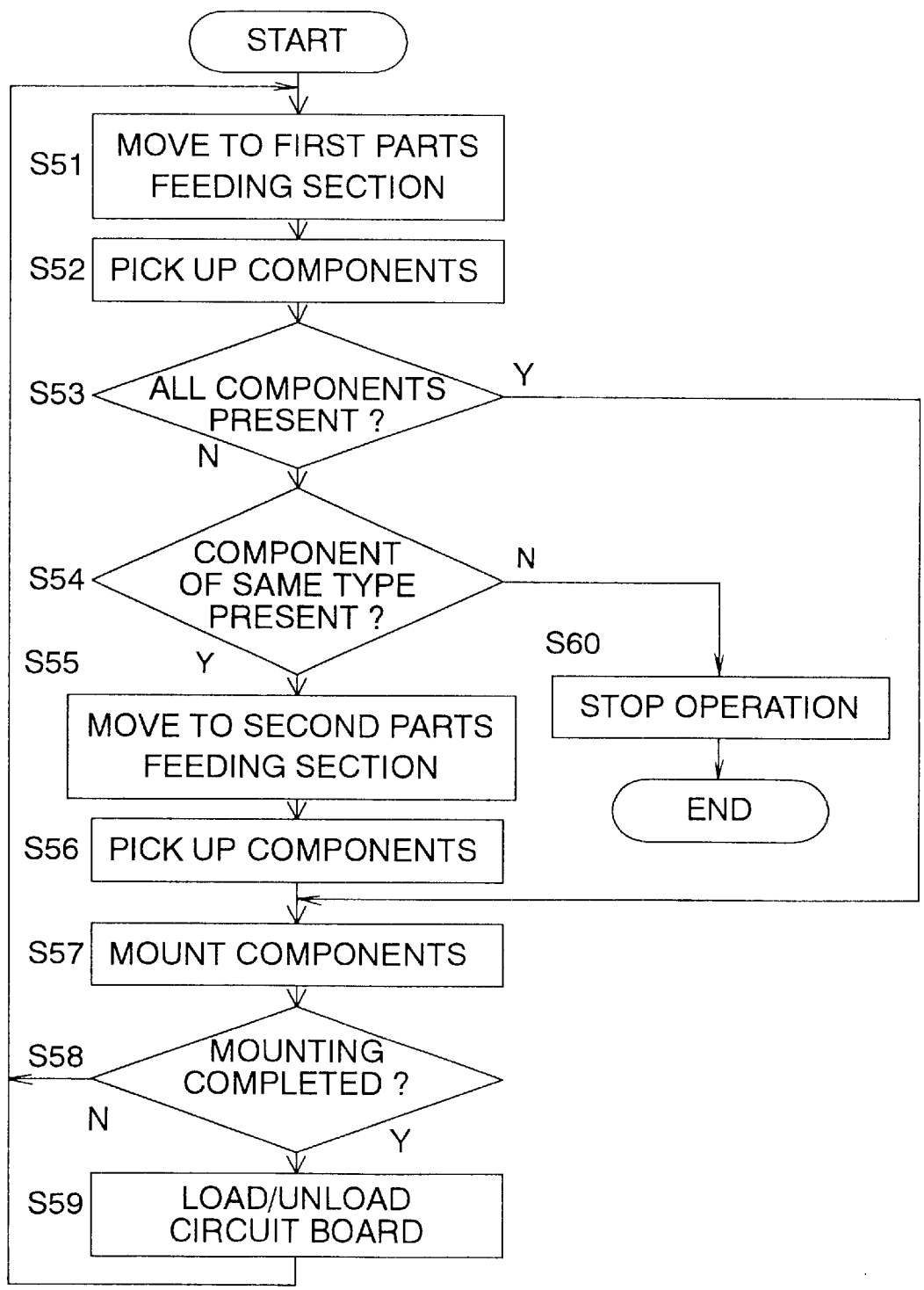
FIG. 6 is a flowchart showing the mounting procedure according to a conventional component mounting method.

The parts cassettes 3 in the first parts feeding section 1 are arranged such that the three suction nozzles 4 can pick up a predetermined combination of three different or identical types of components at one time. Correspondingly, the predetermined sets of parts cassettes 3 are prepared in the second parts feeding section 2, in the same arrangement as that of the first parts feeding section 1. Therefore, when one of the three different or identical types of components in a predetermined combination is exhausted at the first parts feeding section 1, the second parts feeding section 2 can provide the three different or identical components of the same combination in the same arrangement. The parts cassettes 3 in the second parts feeding section 2 are thus aligned in a specific order in accordance with desired combinations of three components and corresponding to the order of parts cassettes in the first parts feeding section 1, and the settings of such order of the parts cassettes in the second parts feeding section 2 are stored in a control unit of the apparatus. Referring to FIG. 5, each of the constituent elements described above is connected to the control unit of the apparatus and operation thereof is controlled in accordance with a predetermined mounting program.

After picking up components from either the first parts feeding section 1 or the second parts feeding section 2, the mounting head 6 moves to above a recognition camera 15 (FIG. 2A), with which an image of each suction nozzle 4 is taken for recognition of the presence of a component on each suction nozzle and of the posture of the component held on each suction nozzle. Therefore, in case components are exhausted in the first or the second parts feeding section, it can be detected by the recognition camera by the absence of a component on a suction nozzle.

The use of a plurality of suction nozzles offers an advantage that mounting efficiency can be raised by effecting control such that all of the suction nozzles pick up components at one time in as many cases as possible. On the other hand, when even one type of component of the three components to be picked up at the same time is exhausted, actions for replenishing the missing component at the second parts feeding section are required, which reduces mounting efficiency considerably, as described in connection with the prior art method. And if the components of the type that has been exhausted in the first parts feeding section are not prepared in the second parts feeding section, the apparatus has to be stopped for replacing the parts cassettes.

FIG. 1 is a flowchart showing the mounting procedure according to the present invention method of mounting components. Reference numerals S1 to S17 represent each step of mounting process and will be referred to in the description below.

First, the mounting head 6 moves toward the first parts feeding section 1 (S1), and each of the suction nozzles 4 picks up electronic components respectively at the same time (S2). At the next step, the mounting head 6 moves to above the recognition camera 15 for determining whether all of the suction nozzles 4 have picked up their respective components (S3). If it is confirmed that all of the suction nozzles 4 have picked up components, the mounting head 6 moves to above the circuit board 5, where mounting of each component onto a circuit board 5 is effectuated. The above actions from step 2 (S2) to step 4 (S4) are repeated until the mounting of a predetermined number of components to one circuit board 5 is completed. When the mounting to one circuit board 5 is completed (S5), the circuit board 5 is unloaded from the apparatus by the unloader 11, while a new circuit board 5 is loaded into the apparatus by the loader 10 (S6), and is fixedly positioned at the predetermined position. The procedure returns to step 1 and the above described mounting actions are repeated.

Components in the first parts feeding section 1 are thus consumed by repeating the above mounting procedure. One or more of the parts cassettes 3 which feed components of a predetermined combination for simultaneous pick-up by the suction nozzles will then run out of components. If this happens, it is detected at step 3 (S3) by the absence of the component which is supposed to be held on a predetermined one of suction nozzles. At step 7 (S7), it is confirmed that the same combination of components in the same arrangement as that of the components which are currently being fed at the first parts feeding section 1 is present in the second parts feeding section 2. Such confirmation should not necessarily be made in real time, however, since it can be known in advance whether the second parts feeding section 2 accommodates the same combination of components as that in the first parts feeding section 1. The mounting head 6 moves to the second parts feeding section 2 (S8), and the suction nozzle 4 that has failed to pick up a component because of component exhaustion at the first parts feeding section picks up the component of the same type (S9). The recognition camera 15 confirms the presence of all the components on all of the suction nozzles 4 (S10), upon which the mounting head 6 moves to above the circuit board 5 for mounting the components there onto (S11).

The combination of components which are picked up at the same time by the suction nozzles can be variously set. For example, all three components can be identical, or different from each other, or two components of same type and one different type of component can be combined. The order of components or parts cassettes 3 can also be freely set in various ways. Moreover, at least two or more of the same combinations of components aligned in the same order can be accommodated in the first parts feeding section 1, as shown in FIG. 2B, and in the second parts feeding section 2 as well, as shown in FIG. 2C. Reference characters A, B, C represent each different type of components respectively contained in parts cassettes 3a, 3b, 3c. If at least two or more of the same combinations of parts cassette are set in the first parts feeding section 1, the mounting head 6 can continue the mounting operation without moving over to the second parts feeding section 2, and the entire mounting operation time can be further reduced.

When, for example, the component A is exhausted in the first parts feeding section 1, the mounting head moves over to the second parts feeding section 2, and the feeding of components is carried on at the second parts feeding section 2 from then onwards. Thereby, the mounting head 6 needs to carry out the component replenishing action only once, when exhaustion of one or more components at the first feeding section 1 is detected first time. The mounting head 6 is thereafter automatically capable of continuing the mounting procedure, owing to the second parts feeding section 2 which provides the same combination of components aligned in the same order.

Thus the mounting action from steps S12 to S15 is performed by feeding of components from the second parts feeding section 2. When the mounting of components to one circuit board 5 is completed (S12), the circuit board 5 is unloaded from the apparatus by the unloader 11, while a new circuit board 5 is loaded into the apparatus by the loader 10 (S16), and the actions from step S13 are restarted.

During the time period the mounting operation is performed with the second parts feeding section 2, the first parts feeding section 1 is at a halt, and the parts cassettes 3 are replaced for preparation of restarting the feeding operation with the first parts feeding section 1. As the mounting operation is repeated, component exhaustion will occur at the second parts feeding section 2, and when this is detected at step S14, the mounting head 6 is moved back to the first parts feeding section 1, to which components have been replenished. Accordingly, the component mounting operation can be carried on further. Similarly, during the time period mounting operation is performed with the first parts feeding section 1, the parts cassettes 3 are replaced at the second parts feeding section 2. Thus the mounting operation can be continued even when components are exhausted again at the first parts feeding section 1, by transferring the mounting head 6 to the second parts feeding section 2.

At step S7 or S10 in the above described procedure, if the components of desired type are not available, mounting cannot be performed further and the apparatus is brought to a stop (S17). However, such a situation hardly arises according to the present invention method, because the feeding operation is switched from one to another of the two parts feeding sections, in which parts cassettes accommodating each type of components are aligned in the same order, and replenishment of components to one parts feeding section is always effected during the feeding operation at the other parts feeding section. By so using the two parts feeding sections alternately, the mounting operation is continued without stopping the apparatus.

In the embodiment described above, the example has been shown in which suction nozzles are used, but the means for holding electronic components is not limited to suction nozzles and can be any other means such as clamps or grippers. The number of suction nozzles is not limited to three as in this embodiment, but can be variously set in accordance with the design of the apparatus or the mounting program.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. An electronic component mounting apparatus comprising:

a parts feeding section including a plurality of components of discrete types and a multiplicity of parts cassettes respectfully accommodating each discrete type of component therein and aligned in a row, said multiplicity of parts cassette being capable of feeding components to a predetermined feeding position; and a mounting head having a plurality of suction nozzles for picking up several components fed at the parts feeding section at one time; wherein the parts feeding section accommodates at least two identical combinations of parts cassettes aligned in the same order, so that components of the same combination and in the same order can be fed to the mounting head at two different positions in the parts feeding section, and wherein a control unit effects control of the mounting head such that, when one or more of the parts cassettes in said predetermined combination of parts cassette (cassettes?) at a predetermined location in the parts feeding section fails to feed a component to a corresponding suction nozzle on the mounting head, the mounting head moves to a different location in the parts feeding section where there are said parts cassettes of the same combination and in the same order, so as to enable the mounting head to pick up several components at one time continuously.

2. An electronic component mounting apparatus comprising:

a first part feeding section including a multiplicity of parts cassettes respectively accommodating discrete types of components therein and aligned in a row;

a second part feeding section including a duplication of the multiplicity of parts cassettes respectively accommodating discrete types of components therein of the first part feeding section;

a load station for receiving a substrate board, the respective first part feeding section and the second part feeding section are respectively positioned on opposite sides of the load station;

a mounting head having a plurality of pick-up members for picking up several components at once is relatively mounted for translating across the load station and operatively engaging the first and second part feeding stations; and a controller for controlling movement of the mounting head to load components on the substrate board positioned at the load station, the controller directs the mounting head to pick up a plurality of components from the first part feeding section and to load the components on the substrate board until it is determined that the first part feeding section is incapable of providing a component, the controller then automatically directs the mounting head to pick up the components from the second part feeding section exclusively until the second part feeding station is incapable of providing a component.

3. An electronic component mounting system comprising:

a first part feeding section including a multiplicity of parts cassettes respectively accommodating discrete types of components therein and aligned in a row;

a second part feeding section including a duplication of the multiplicity of parts cassettes respectively accommodating discrete types of components therein of the first part feeding section;

a load station for receiving substrate board, the respective first part feeding section and the second part feeding section are respectively positioned on the opposite sides of the load station;

a mounting head having a plurality of pick-up members for picking up several components at once is relatively mounted for translating across the load station and operatively engaging the first and second part feeding stations;

a recognition camera operatively mounted to image the picked up components on the mounting head; and a controller for controlling movement of the mounting head to load components on the substrate board positioned at the load station, the controller directs the mounting head to pick up a plurality of components from the first part feeding section, position the mounting head for imaging by the recognition camera, and to load the components on the substrate board until it is determined that the first part feeding section is incapable of providing a component as a result of image signals from the recognition camera, the controller then automatically directs the mounting head to pick up the components from the second part feeding section exclusively until image signals from the recognition camera indicate that the second part feeding station is incapable of providing a component and then the controller automatically directs the mounting head to resume the picking up of components from the first part feeding section.

* * * * *